(12) United States Patent
Yu et al.

(10) Patent No.: US 7,435,104 B2
(45) Date of Patent: Oct. 14, 2008

(54) SOCKET ASSEMBLY

(75) Inventors: Wei Yu, ShenZhen (CN); Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/656,079

(22) Filed: Jan. 22, 2007

(65) Prior Publication Data

US 2007/0173081 A1    Jul. 26, 2007

(30) Foreign Application Priority Data

Jan. 20, 2006    (TW) ............................... 95201400 U (51) Int. Cl.
*H01R 13/62* (2006.01)
(52) U.S. Cl. ........................................ 439/73; 439/331
(58) Field of Classification Search ................ 439/73, 439/331, 71, 72, 330
See application file for complete search history.

(56) References Cited

U.S. PATENT DOCUMENTS

| | | | |
|---|---|---|---|
| 6,939,140 B2* | 9/2005 | Liao | 439/41 |
| 6,974,345 B2* | 12/2005 | Yang et al. | 439/331 |
| 7,179,092 B2* | 2/2007 | Ma | 439/73 |
| 2005/0233628 A1* | 10/2005 | Yang et al. | 439/331 |
| 2006/0116007 A1* | 6/2006 | Ma | 439/73 |

\* cited by examiner

*Primary Examiner*—Gary F. Paumen
(74) *Attorney, Agent, or Firm*—Wei Te Chung (57) ABSTRACT

An electrical connector (1) comprises an insulative housing (4), a stiffener (6) defined around the housing (4), a clip (7) pivotably engaged on one end of the stiffener (6), and a lever (8) engaged on an opposite end of the stiffener (6) for fastening the clip (7) onto the housing (4). The housing (4) comprises an upper surface (44) and a lower surface (45) opposite to the upper surface (44) and a platform surface (47) projected between the upper surface (44) and the lower surface (45) and a planar sidewall (40) surrounded thereof. The sidewall (1) comprises an upper section (42) and a lower section (48) that is the circumference of the upper sidewall (42) is longer than that of the lower sidewall (48). The lower sidewall (48) is enveloped by the first sidewall (481) and the second sidewall (482) opposite to the first sidewall (481) and configured as a shape similar to that of the opening (603) of the stiffener (6), hence the housing (4) can be interferentially mounted into the opening (603) of the stiffener (6). The housing (4) defines a number of positioning poles (401) on the platform surface (47) adjacent to the outside of the first sidewall (481) of the housing (4). The stiffener (6) defines a number of recesses (69) for receiving the poles (401). In addition, the stiffener (6) defines a number of projections (641) projected toward the platform surface (47) of the housing (4) for engaging with the platform surface (1).

18 Claims, 8 Drawing Sheets

SOCKET ASSEMBLY

BACKGROUND OF THE INVENTION

1. Field of the Invention

The present invention relates to an electrical socket assembly for electrically connecting an electronic package such as an chip module with a circuit substrate such as a printed circuit board (PCB), and particularly to an electrical socket assembly adapted for receiving a chip module therein and electrically connecting with a PCB.

2. Description of the Prior Art

Figure 1:
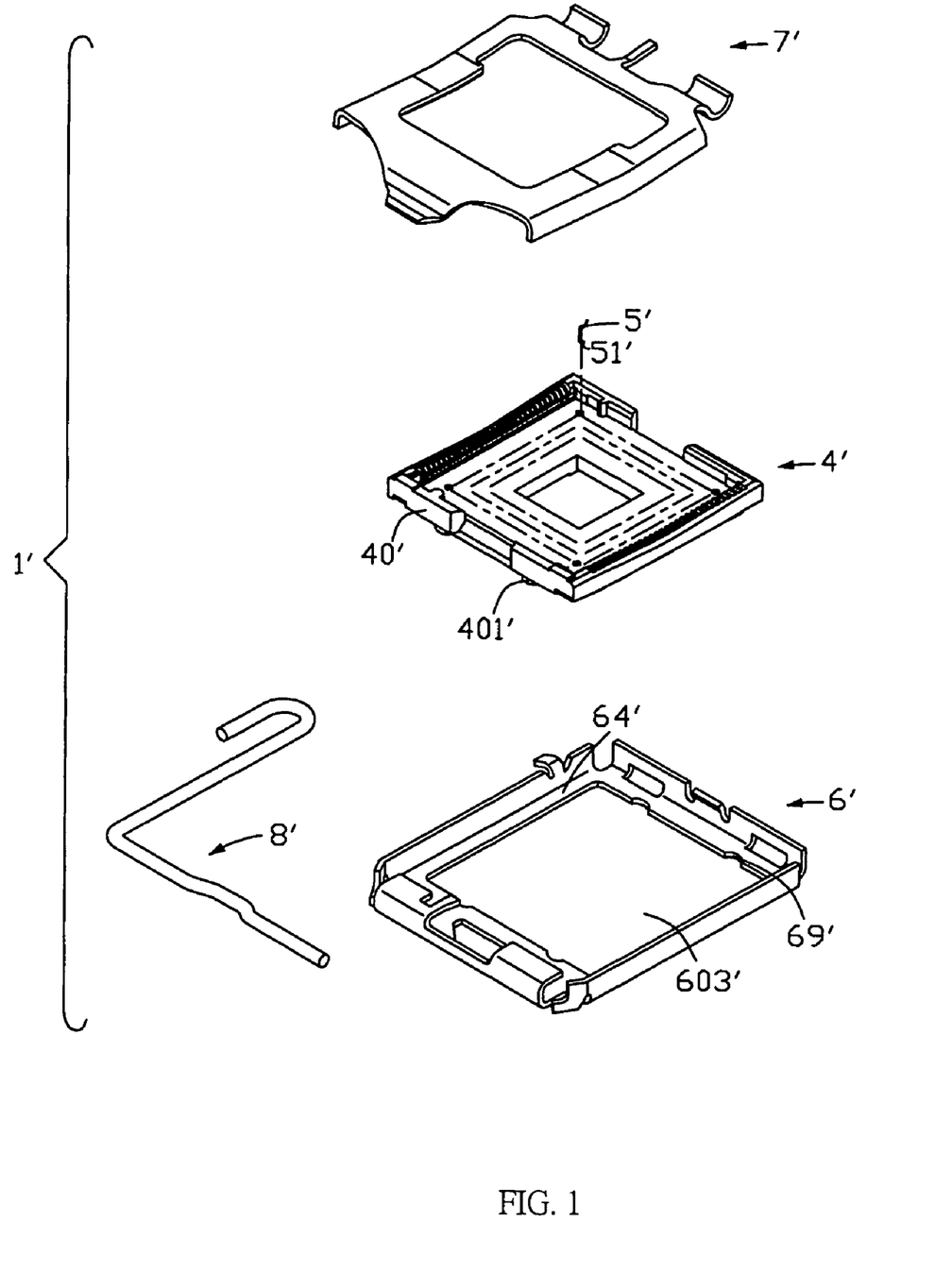
FIG. 1 is an exploded, isometric view of a conventional electrical connector in accordance with the embodiment of the present invention, together with a land grid package ready to be mounted onto the housing of the land grid array connector.
Figure 2:
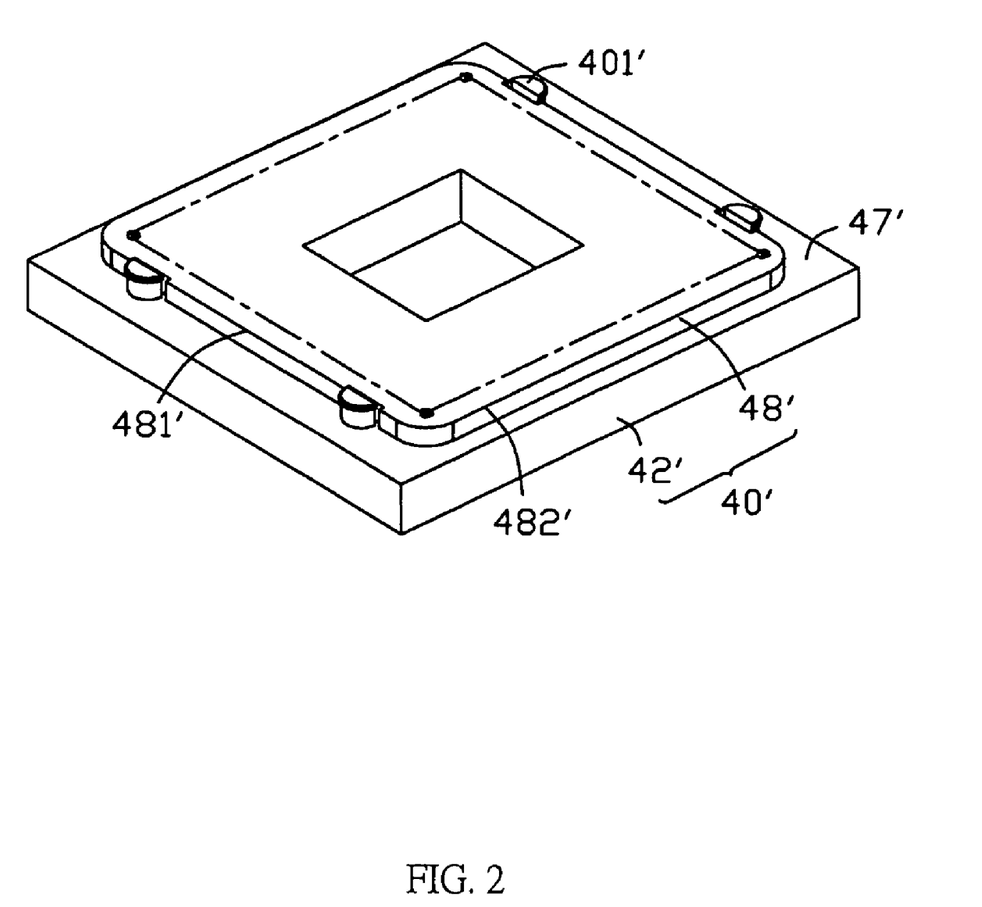
FIG. 2 is a bottom view of the connector in FIG. 1.
Figure 3:
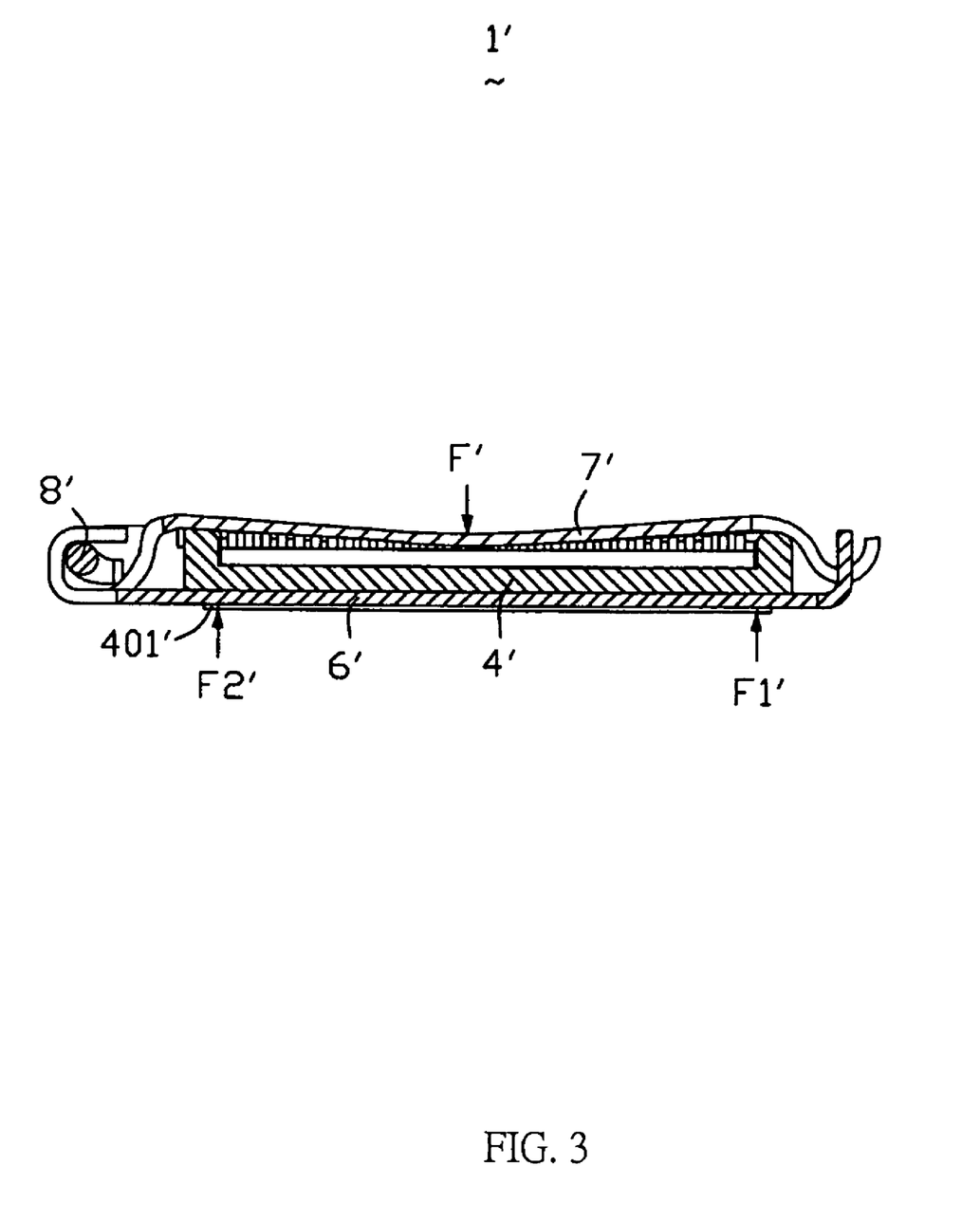
FIG. 3 is an analysis view of the forces applied on the connector of FIG. 1.
Figure 4:
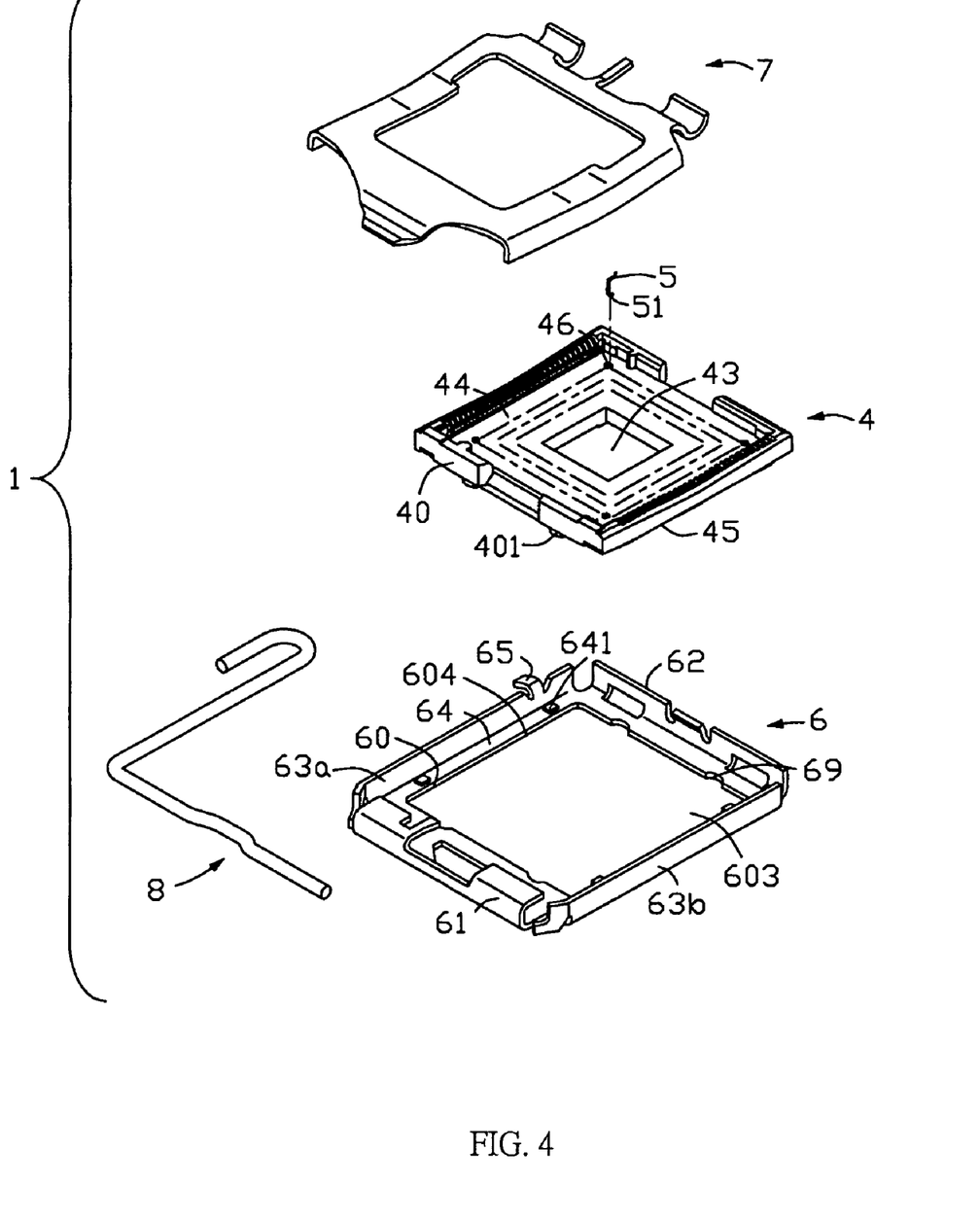
FIG. 4 is an exploded, isometric view of an electrical connector in accordance with the embodiment of the present invention.
Figure 5:
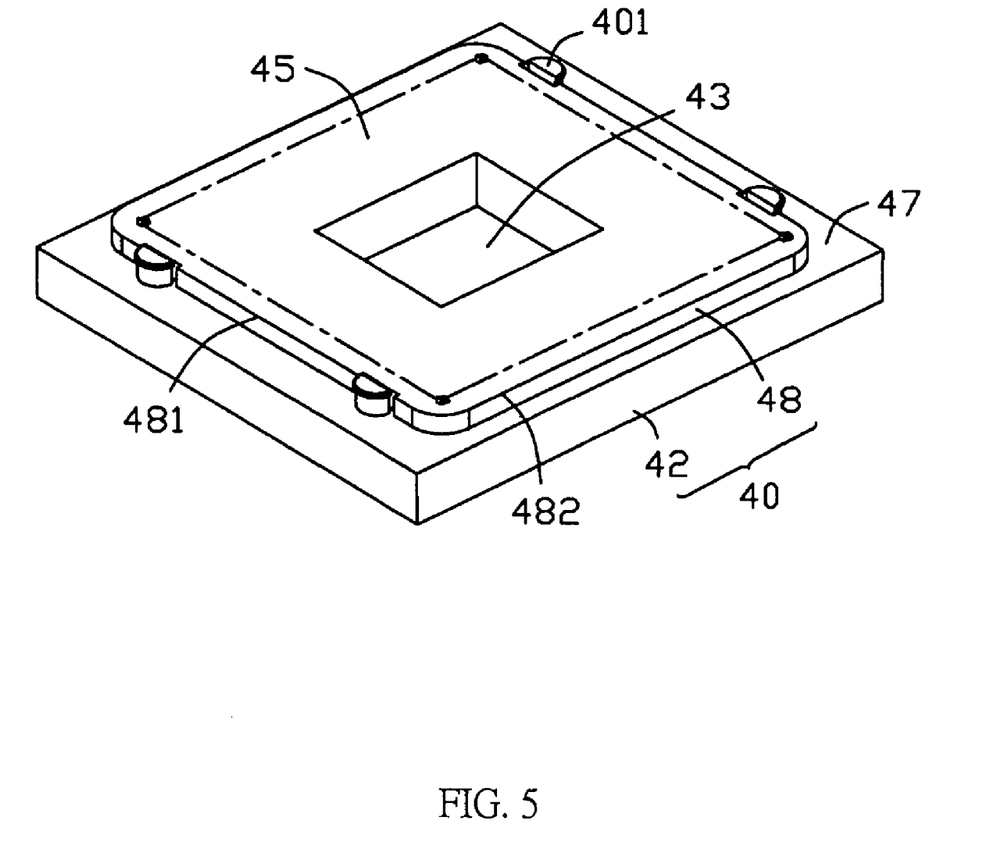
FIG. 5 is a bottom view of the connector in FIG. 4.
Figure 6:
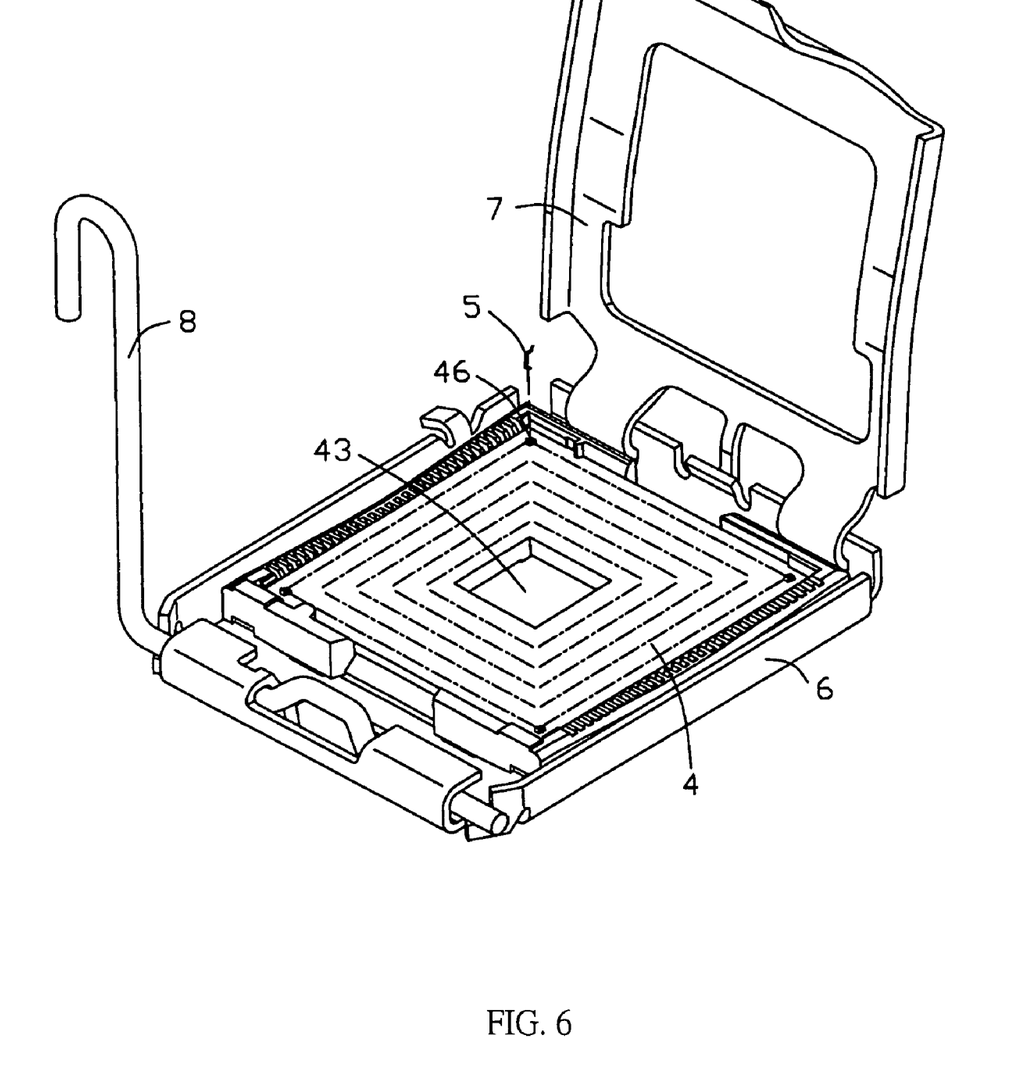
FIG. 6 is an exploded, isometric view of the connector in FIG. 4, with the clip open.
Figure 7:
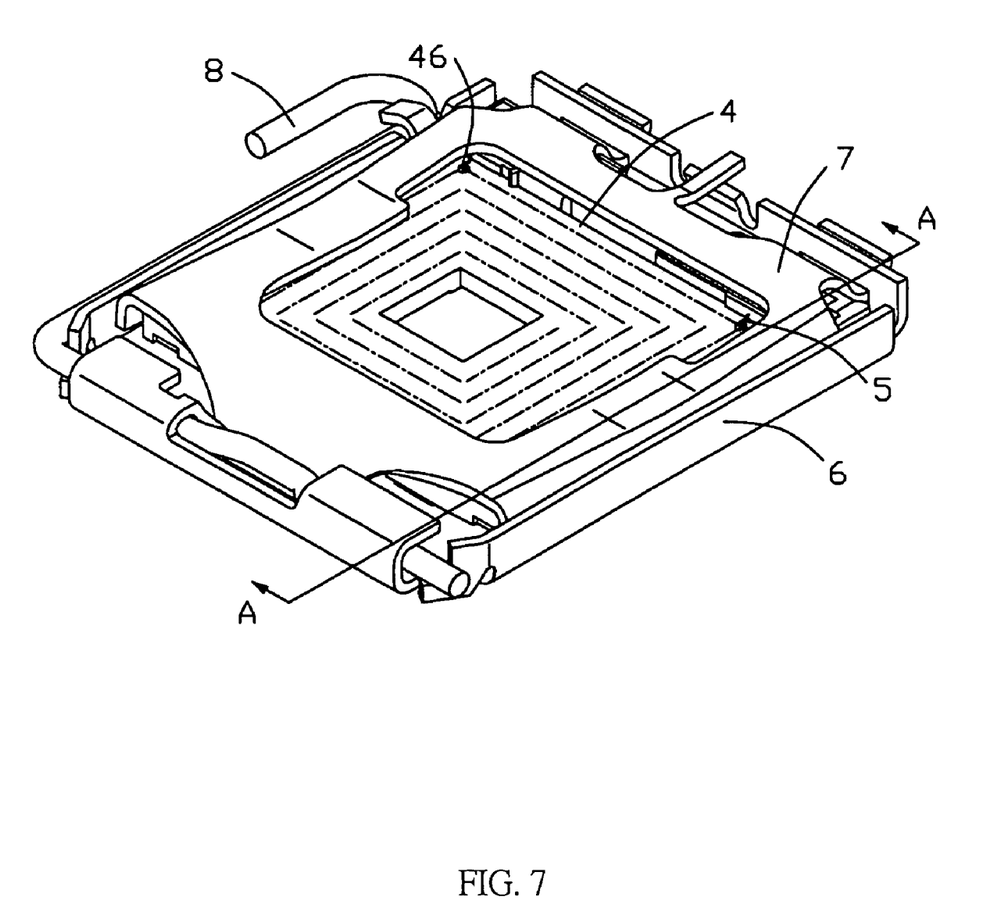
FIG. 7 is an exploded, isometric view of the connector in FIG. 4, with the clip closed.
Figure 8:
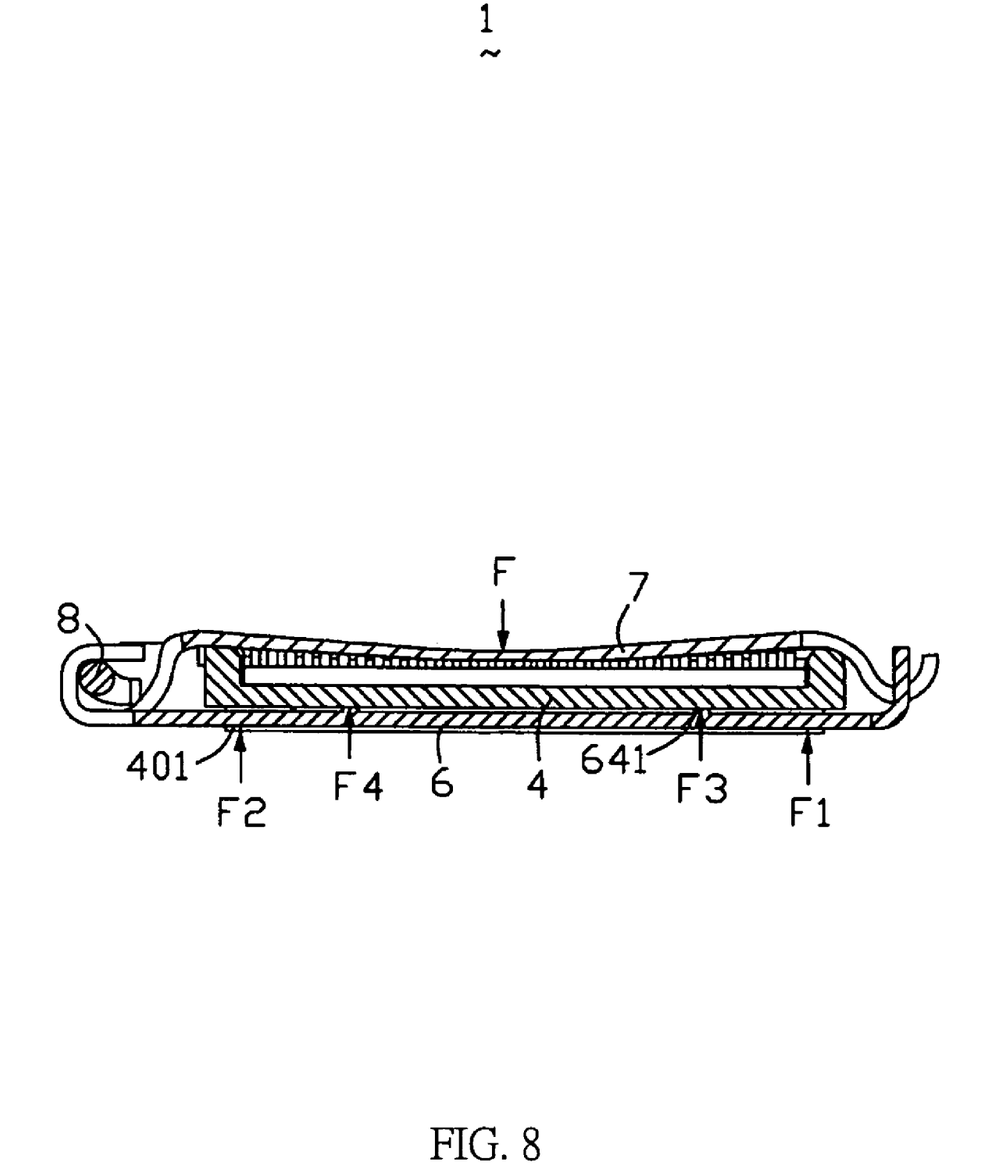
FIG. 8 is an analyzing perspective view of force applied on the connector in FIG. 7, with the connector cut in a direction of line I-I.

Referring to FIGS. 1-3, a convention electrical connector 1' is illustrated. The connector 1' comprises an insulative housing 4', a stiffener 6' defined around the housing 4', a metal clip 7' pivotably engaged on one end of the stiffener 6', and a lever 8' engaged on an opposite end of the stiffener 6' for fastening the clip 7' onto the housing 4'. The housing 4' comprises an upper surface 44' and a lower surface 45' opposite to the upper surface 44' and a platform surface 47' projected between the upper surface 44' and the lower surface 45' and a planar sidewall 40' surrounded thereof. The sidewall 40' comprises an upper section 42' and a lower section 48 that is the circumference of the upper sidewall 42' is longer than that of the lower sidewall 48'. The lower sidewall 48' is enveloped by the first sidewall 481' and the second sidewall 482' opposite to the first sidewall 481 and configured as a shape similar to that of the opening 603' of the stiffener 6', hence the housing 4' can be interferentially mounted into the opening 603' of the stiffener 6'. The housing 4' defines a number of positioning poles 401' on the platform surface 47' adjacent to the outside of the first sidewall 481' of the housing 4'. The stiffener 6' defines a number of recesses 69' for receiving the poles 401'. When the housing 4' is positioned on the stiffener 6', the poles 401' of the housing 4' are received into the recess 69' of the stiffener 6 for getting a tightly interfering fit. At the moment, the upper surface 64' of the stiffener 6' is abutting against the platform surface 47' of the housing 4'. When the chip module is mounted into the electrical connector 1' and both connected to the printed circuit board, the clip 7' applies a normal force on the chip module, which is vertical to a plane formed by the terminals 5' to connect the chip module to the printed circuit board.

However, the connector 1' has following drawbacks: the electrical connector 1' assembled the chip module is connected with the printed circuit board, the chip module applies a normal force F' on the housing 4' along a direction vertical to the plane formed by the terminals 5, and the housing 4' supports the normal force F' by the interfering fit between the poles 401' of the housing 4' and the recess 69' of the stiffener 6. So the housing 4 is easy to be bended by the forces F1' and F2' applied by the stiffener 6' and the force F' applied by the chip module. In this case, the solder balls 51' of the terminals 5' can not be accurately soldered with the printed circuit board, which affects the reliability of the connection between the chip module and the printed circuit board.

In view of the above, a new LGA connector which overcomes the above-mentioned disadvantages is desired.

SUMMARY OF THE INVENTION

Accordingly, an object of the present invention is to provide an LGA connector that can prevent undesired engagement between the clip and the stiffener, therefore ensuring reliability connecting performance of the LGA connector.

To achieve the above-mentioned object, an electrical connector in accordance with the present invention comprises an insulative housing, a stiffener defined around the housing, a clip pivotably engaged on one end of the stiffener, and a lever engaged on an opposite end of the stiffener for fastening the clip onto the housing. The housing comprises an upper surface and a lower surface opposite to the upper surface and a platform surface projected between the upper surface and the lower surface and a planar sidewall surrounded thereof. The sidewall comprises an upper section and a lower section that is the circumference of the upper sidewall is longer than that of the lower sidewall. The lower sidewall is enveloped by the first sidewall and the second sidewall opposite to the first sidewall and configured as a shape similar to that of the opening of the stiffener, hence the housing can be interferentially mounted into the opening of the stiffener. The housing defines a number of positioning poles on the platform surface adjacent to the outside of the first sidewall of the housing. The stiffener defines a number of recesses for receiving the poles. In addition, the stiffener defines a number of projections projected toward the platform surface of the housing for engaging with the platform surface.

Relative to the conventional art, the connector defines a number of projections abutting against with the platform of the housing, which can provide a supporting force for balancing the force applied by the chip module, which improves the anti-bending performance of the housing and the strained condition. Thus the terminals can be accurately soldered to the printed circuit board and the reliability of the land grid array connector is ensured.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Referring to FIGS. 4-8, an electrical socket assembly 1 in accordance with the embodiment of the present invention comprises an insulative housing 4, a plurality of terminals 5 received in the housing 4, a stiffener 6 defined around the housing 4, a metal clip 7 pivotably engaged on one end of the stiffener 6, and a lever 8 engaged on an opposite end of the stiffener 6 for fastening the clip 7 onto the housing 4. A chip module is ready to be disposed between the housing 4 and the clip 7, for connecting with the printed circuit board via the connector 1.

The housing 4 has a substantially rectangular configuration with a plurality of side surfaces 40 and a center concave 43 thereof. A plurality of passageways 46 is defined in the housing 4 for receiving a corresponding number of electrical contacts 5 therein. In addition, the housing 4 comprises an upper surface 44 and a lower surface 45 opposite to the upper surface 44 and a platform surface 47 projected between the upper surface 44 and the lower surface 45 and the planar sidewall 40 surrounded thereof. The sidewall 40 comprises an upper section and a lower section that is the circumference of the upper sidewall 42 is longer than that of the lower sidewall 48. The lower sidewall 48 is enveloped by the first sidewall 481 and the second sidewall 482 opposite to the first sidewall 481 and configured as a shape similar to that of the opening 603 of the stiffener 6, hence the housing 4 can be interferentially mounted into the opening 603 of the stiffener 6. The housing 4 defines a number of positioning poles 401 on the platform surface 47 adjacent to the outside of the first sidewall 481 of the housing 4.

The terminals 5 are inserted in the passageways 46 and one end of each terminal 5 is extending upwardly and beyond the upper surface 44 of the housing 4 for connecting with the conductive pads of the chip module, and the other end of the terminal 5 is plated with solder ball 51 for being soldered to the printed circuit board.

The stiffener 6 comprises a bottom plate 60 and a front wall 61 and a rear wall 62 extending upwardly from the bottom plate 60, and a pair sidewalls 63a, 63b connecting with the front wall 61 and the rear wall 62. One of sidewalls 63a, 63b defines an arched hook 65 for securely positioning the lever 8 therein. The bottom plate 60 defines a number of recesses 69 for receiving the projected poles 401 and defines a rectangular opening 603 for receiving the housing 4 therein. The opening 4 is enveloped by the lateral sides 604 and formed into a shape similar to the lower sidewalls 48 of the housing 4. The bottom plate 60 defines a number of supporting arrangements arranged between bottom portion and the base plate such that the bottom portion is distant to the base plate. In this embodiment the supporting arrangements are disposed as a number of projections 641, which extend from the sidewall 63a toward another sidewall 63b in a lengthwise direction and are distributed in a symmetry arrangement. The projections 641 are preferred arranged as even numbers. In other embodiments the supporting arrangements can be disposed as a number of projections, which extend from a lower surface of the housing 4 and are distributed in a symmetry arrangement. The projections are preferred arranged as even numbers.

In assembly, the clip 7 and lever 8 are engaged with the front wall 61 and the rear wall 62 of the stiffener 6 respectively, and then the clip 7 is oriented faraway the stiffener 6 by actuating the lever 8 and putting the housing 4 assembled the terminals 5 into the stiffener 6. In the process, the projections 641 of stiffener 6 are disposed on the outside of the second sidewall 482 of the housing 4 adjacent to the lower sidewall 48, and abutting against the platform surface 47 of the housing 4. At the moment, the housing 4 is pressured by the force F applied by the chip module, the force F produced by the interfering fit between the positioning poles 401 and the recess 69, and force FF applied by the projections 641 which increases the anti-bending performance of the housing 4 and ensure the force applied on housing 4 a balance situation. Thus the terminals 5 can be accurately soldered to the printed circuit board and the reliability of the connector is ensured.

It is need to note the projections 641 of abovementioned stiffener 6 are arranged continuous form but the discontinuous arrangement is also fitly in the connector. When the number of the projections 641 defined on the stiffener 6 is more than four, the projections 641 arranged on adjoin position between the bottom plate and the rear sidewall 62 and front sidewall 61 are preferred lower than those of other places.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical socket assembly for interconnecting a chip module and a circuit substrate, the socket comprising:
   a stiffener including a base plate with upper and lower surfaces, an opening defined in a central area thereof, and peripheral walls extending upward from edges of the base plate;
   a clip pivotally attached to an end of the stiffener;
   a lever pivotally attached to an other end of the stiffener for pressing a free end of the clip toward the base plate; and
   a connector having a housing with a plurality of terminals assembled therein, the housing including a bottom portion partially extending through the opening of the base plate, and partially sitting onto the stiffener;
   wherein a supporting arrangement is arranged between the bottom portion and the base plate such that the bottom portion is distant to the base plate.

2. The socket assembly as claimed in claim 1, wherein said supporting arrangement is disposed on a lower surface of the housing for abutting against the stiffener to provide the housing thereon in a balanced situation.

3. The socket assembly as claimed in claim 1, wherein said supporting arrangement is disposed on an upper surface of the stiffener such that the housing partially supported thereon lies in a balanced situation.

4. The socket assembly as claimed in claim 2, wherein said supporting arrangement is formed with a number of projections arranged on the lower surface of the housing.

5. The socket assembly as claimed in claim 3, wherein said supporting arrangement is formed with a number of projections arranged on the upper surface of the stiffener.

6. The socket assembly as claimed in claim 5, wherein the housing comprises an upper surface and a lower surface opposite to the upper surface and a platform surface projected between the upper surface and the lower surface and a planar sidewall surrounded thereof.

7. The socket assembly as claimed in claim 6, wherein the sidewall comprises an upper section and a lower section and the circumference of the upper sidewall is longer than that of the lower sidewall.

8. The socket assembly as claimed in claim 7, wherein the lower sidewall comprises a first sidewall and a second sidewall opposite to the first sidewall, and the housing defines a number of positioning poles on an outside of the first sidewall and the stiffener defines a number of recess for receiving the positioning pole therein.

9. The socket assembly as claimed in claim 8, wherein the projections are disposed a portion on the stiffener in correspondence with outside of the second sidewall of the lower sidewall.

10. The socket assembly as claimed in claim 9, wherein the projections are arranged symmetrically.

11. A socket assembly for interconnecting a land grid package and a circuit substrate, the connector comprising:
- a stiffener defined around the housing, the stiffener comprising a bottom plate with an upper face thereon and a plurality of side walls extending upwardly therefrom;
- a clip mounted upon one of said side walls of the stiffener in a moveable manner, the clip comprising a main plate;
- a lever mounted on other portions of the stiffener for fastening the clip;
- a housing comprising a plurality of passageways therethrough;
- a number of terminals received in the corresponding passageways of the housing respectively;
- wherein a flatness counter-arrangement is applied on the bottom plate such that the housing partially supported thereon lies in a balanced situation under a condition that other portions of the housing are vertically spaced from the bottom plate.

12. The socket assembly as claimed in claim 11, wherein said flatness counter-arrangement is a number of projections arranged in a continuous form.

13. The socket assembly as claimed in claim 11, wherein the housing partially seated on the stiffener defines a stepped bottom portion including a projected portion in a center thereof and a concave portion enveloping the projected portion, said flatness counter-arrangement defines a plurality of protrusions abutting against the concave portion of the housing to get a balance consideration thereof.

14. The socket assembly as claimed in claim 13, wherein the bottom plate defines a pair of first side portions in a front-to-rear direction and a second side portions in a lengthwise direction, the projections are disposed on the first side portions.

15. The socket assembly as claimed in claim 13, wherein said side plate extends downward in a straight manner.

16. A socket assembly comprising:
- a metallic stiffener defining a central opening;
- an insulative housing having a peripheral region seated upon an upper face of the stiffener around a periphery of said opening, and a central region extending downwardly through and beyond the opening;
- two opposite ends of the stiffener, along a lengthwise direction, experiencing upward forces while the housing experiencing a downward force; and
- a plurality of projections located between the a bottom face of the peripheral region and the upper face of the stiffener, so as to assure a space is kept therebetween.

17. The socket assembly as claimed in claim 16, wherein said projections are only arranged along lengthwise sides thereof in said lengthwise direction and spaced from each other along said lengthwise direction.

18. The socket assembly as claimed in claim 16, wherein said projections are formed on the stiffener.

* * * * *